(12) United States Patent
Reitterer et al.

(10) Patent No.: US 11,016,374 B2
(45) Date of Patent: May 25, 2021

(54) APPARATUS FOR PROJECTING A LIGHT SPOT

(71) Applicant: TriLite Technologies GmbH, Vienna (AT)

(72) Inventors: Joerg Reitterer, Brunn am Gebirge (AT); Franz Fidler, Vienna (AT); Anna Balbekova, Vienna (AT); Gerhard Schmid, Waldkirchen (AT); Ferdinand Saint Julien-Wallsee, Vienna (AT)

(73) Assignee: TriLite Technologies GmbH, Vienna (AT)

( * ) Notice: Subject to any disclaimer, the term of this patent is extended or adjusted under 35 U.S.C. 154(b) by 0 days.

(21) Appl. No.: 16/595,799

(22) Filed: Oct. 8, 2019

(65) Prior Publication Data

US 2020/0110331 A1  Apr. 9, 2020

(30) Foreign Application Priority Data

Oct. 9, 2018 (EP) .................................... 18199390

(51) Int. Cl.
*H04N 9/31* (2006.01)
*G03B 21/20* (2006.01)
(Continued)

(52) U.S. Cl.
CPC ......... *G03B 21/2033* (2013.01); *G02B 26/04* (2013.01); *G02B 27/30* (2013.01);
(Continued)

(58) Field of Classification Search
CPC .. H04N 9/3129; H04N 9/3132; H04N 9/3135; H04N 9/3161; G03B 21/2033; G03B 2/28; G02B 27/30
See application file for complete search history.

(56) References Cited

U.S. PATENT DOCUMENTS

| 2003/0058515 A1 | 3/2003 | Sanford |
| 2009/0122275 A1* | 5/2009 | Nagashima .......... H04N 9/3155 353/85 |

(Continued)

FOREIGN PATENT DOCUMENTS

EP   2 678 856 B1   8/2017

OTHER PUBLICATIONS

Partial Search Report of EP 18 199 390.8-1020 dated Apr. 10, 2019.
(Continued)

*Primary Examiner* — Ryan D Howard
(74) *Attorney, Agent, or Firm* — Hoffmann and Baron, LLP

(57) ABSTRACT

The disclosed subject matter relates to an apparatus for projecting a light spot, comprising a light source emitting a light beam having a wavelength and a divergence angle, a mirror arranged in the path of the light beam to deflect said light beam about a nominal deflection angle, the mirror having a surface with a known curvature, and a collimation lens arranged between the light source and the mirror in the path of the light beam, wherein the lens is mounted at a distance $z_1 \neq f_1$ from the light source, $f_1$ being the focal length of the lens, and wherein the distance $z_1$ is chosen such that the width of the deflected light beam has a minimum at a predetermined projection distance.

15 Claims, 6 Drawing Sheets

(51) Int. Cl.
*G02B 27/30* (2006.01)
*G02B 26/04* (2006.01)
*G03B 21/28* (2006.01)
*G02B 5/08* (2006.01)
*H01S 5/183* (2006.01)

(52) U.S. Cl.
CPC ........... *G03B 21/28* (2013.01); *H04N 9/3129* (2013.01); *G02B 5/08* (2013.01); *H01S 5/183* (2013.01)

(56) References Cited

U.S. PATENT DOCUMENTS

2015/0303656 A1 10/2015 Morita et al.
2016/0255316 A1* 9/2016 Kobori ................ H04N 9/3135
348/746

OTHER PUBLICATIONS

Extended Search Report of EP 18 199 390.8-1020 dated Jul. 12, 2019.

\* cited by examiner (State of the Art)

(State of the Art)

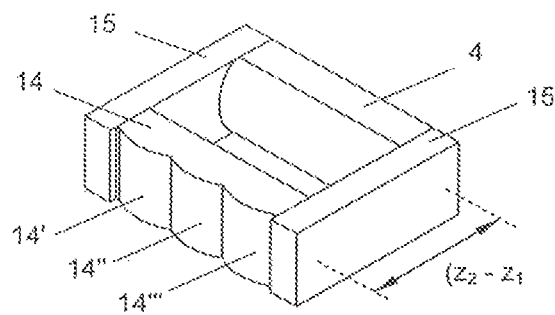
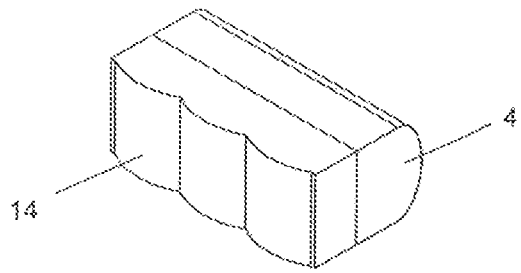
*Fig. 8a*  *Fig. 8b*
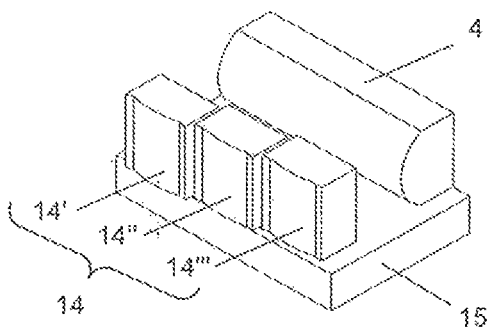
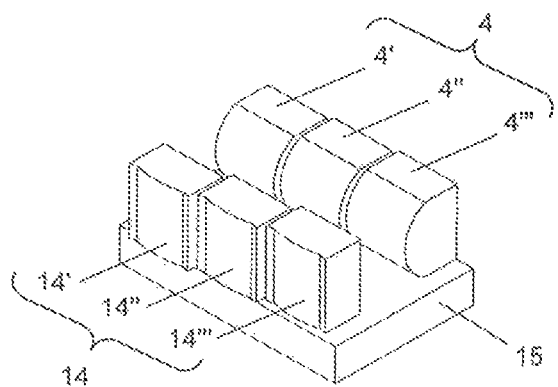
*Fig. 9a*  *Fig. 9b*
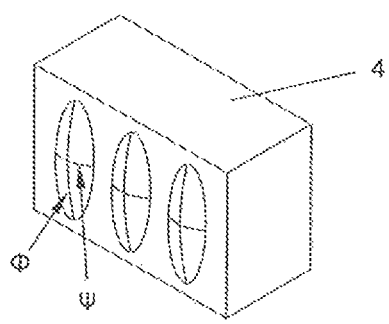
*Fig. 10*

APPARATUS FOR PROJECTING A LIGHT SPOT

CROSS-REFERENCE TO RELATED APPLICATIONS

This application claims priority to European Patent Application No. 18 199 390.8, filed on Oct. 9, 2018, the entirety of which is incorporated by reference herein.

TECHNICAL FIELD

The present disclosed subject matter relates to an apparatus for projecting a light spot, comprising a light source emitting a light beam having a wavelength and a divergence angle, a mirror arranged in the path of the light beam to deflect said light beam about a nominal deflection angle, the mirror having a surface with a known curvature, and a collimation lens arranged between the light source and the mirror in the path of the light beam.

BACKGROUND ART

In the state of the art is it known to project a light spot onto a viewing zone for projection of a light signal, may it be a screen or directly onto an audience. To this end, a light source emits a light beam onto a MEMS (micro-electro-mechanical system) mirror, which oscillates to deflect the light beam into different directions, see for example EP 2 678 856 B1.

From EP 2 678 856 B1 it is also known to arrange a collimation lens between the light source and a MEMS mirror to collimate the light beam before deflection as, due to diffraction, the light beam inherently diverges when emitted by the light source. Collimated light beams are necessary to localize the light spot onto a small area in a distance far away from the light source, creating an optimal resolution of the projected light spot. However, it has been observed in experiments that the combination of a light source, a collimation lens, and a MEMS mirror as shown in EP 2 678 856 B1 projects lights spots that are still not optimally localized, i.e., the light beams were still not sufficiently collimated even though appropriate lenses were chosen.

BRIEF SUMMARY

It is thus an object of the disclosed subject matter to provide an improved apparatus comprising a light source, a collimation lens, and a mirror for projecting a light spot. This aim is achieved with an apparatus for projecting a light spot, comprising a light source emitting a light beam having a wavelength and a divergence angle, a mirror arranged in the path of the light beam to deflect said light beam about a nominal deflection angle, the mirror having a surface with a known curvature, and a collimation lens arranged between the light source and the mirror in the path of the light beam, wherein the lens is mounted at a distance $z_1 \neq f_1$ from the light source, $f_1$ being the focal length of the lens, and wherein the distance $z_1$ is chosen such that the width of the deflected light beam has a minimum at a pre-determined projection distance.

The term "mirror" as used herein encompasses all sorts of MEMS mirrors, macroscopic mirrors, or even entire mirror systems comprised of multiple and/or cascaded mirrors.

Applicant's research has shown that the apparatus disclosed in EP 2 678 856 B1 could not optimally collimate laser spots due to an unwanted curvature of the mirror surface of the MEMS mirror. When manufacturing the mirror surfaces, flat silicon substrates are typically coated with a reflective thin film for increasing the MEMS mirror's reflectivity in the desired wavelength range. However, growth-induced stress effects and differences in the coefficient of thermal expansion of the silicon substrate and the thin film can cause compressive or tensile stress, inducing a convex or concave curvature on the mirror, respectively. Depending on the choice of coating, e.g., aluminum for deflecting light beams in the visible wavelength range or gold for deflecting light beams in the infrared wavelength range, and thin film deposition parameters, the curvature of the mirror was either convex or concave with varying curvatures. Different manufacturing techniques for the mirror surfaces turned out to be either too expensive for serial production, led to unwanted behavior or malfunctioning of the MEMS mirror, or were downright impossible.

Another factor that impacted the collimation of the light beam is that the light source emits a non-linearly diverging light beam. This non-linearity is due to the finite opening of the light source and can be approximated as a Gaussian beam propagation, to which a divergence angle can be attributed. Optimally "collimating" a non-linearly diverging light beam causes a beam waist to form at a pre-determined distance. Moving the lens away from the distance $z_1$ corresponding to the focal length $f_1$ of the lens not only causes the beam waist to move away from its "optimally calibrated" position but also increases the deviation from an optimal collimation. This makes it especially counter-intuitive to "decalibrate" the lens for non-linearly diverging light beams.

The disclosed solution introduces an intended misalignment of the lens to compensate for effects caused by the curvature of the mirror surface. For an optimal system, i.e., a system where the mirror surface is completely flat, the best collimation can be achieved if the distance from the lens to the light source equals the focal length of the lens. In the disclosed solution, however, the distance $z_1$ from the lens to the light source is chosen to compensate the undesired curvature of the mirror surface, i.e., such that the width of the deflected light beam has a minimum at a pre-determined projection distance.

It should also be highlighted that the disclosed solution manages to achieve a collimation of the light beam after deflection by the curved mirror which is at least as good as that of the state of the art where $z_1 = f_1$ and the light beam is deflected by a flat mirror.

The choice for the distance $z_1$ can be made computationally or empirically. Once the curvature of the mirror, the divergence angle of the light beam, the wavelength of the light beam, the focal length of the lens, the deflection angle, and the distance of the mirror to the lens is known, determination of the distance $z_1$—under the condition that the width of the deflected light beam has a minimum at a pre-determined projection distance—can be determined analytically or numerically.

In one embodiment, the mirror is convex and the distance $z_1$ is larger than the focal length $f_1$. In this case, the calibration of the apparatus is straight-forward because the minimum of the beam width—before the light beam is deflected by the mirror—lies in the direction of the light beam after the lens and is thus easily measurable.

In another embodiment, the mirror is concave and the distance $z_1$ is smaller than the focal length $f_1$. This setup can be more difficult to calibrate because the minimum of the beam width—before the light beam is deflected by the mirror—sometimes lies in the direction of the light beam even behind the light source (the minimum beam width is "virtual").

Optionally, the mirror is configured to oscillate about said nominal deflection angle between a minimum and a maximum deflection angle and the distance $z_1$ is chosen such that the width of the deflected light beam has a minimum at an intermediate angle different from said nominal deflection angle in order to have the same beam width at the minimum and the maximum deflection angle. It has been observed that—once the mirror starts oscillating about the nominal deflection angle—the beam width changes differently when the deflection angle decreases and when it increases. For example, the beam width is only 10% lager (with respect to the beam width at the nominal deflection angle) when the deflection angle is at the minimum deflection angle, while the beam width is 25% larger when the deflection angle is at the maximum deflection angle. To even the distribution out over the full range of the deflection angle of the MEMS mirror, the optimal beam width is not set to the nominal deflection angle but to the intermediate deflection angle, which for example deviates 5°-15°, e.g., substantially 10°, from the nominal deflection angle. This achieves an improved spatial resolution of the projected light spot because the level of distortion deviates less overall.

Some light sources emit light beams that diverge uniformly in every direction perpendicular to the light path, e.g., vertical-cavity surface-emitting lasers (VCSEL). For such light sources, circular lenses can be used, i.e., lenses that have the same curvature in every direction perpendicular to the light path. Other light sources, however, emit light beams that have two different axes of divergence, which are called "fast axis" and "slow axis" in the art. For such light sources, the disclosed subject matter provides different embodiments.

In a first embodiment, where the divergence angle of the light beam is different in a first axis and in a second axis, said lens is configured to collimate the light beam only in the first axis, wherein the disclosed apparatus further comprises a second lens configured to collimate the light beam only in the second axis and having a second focal length $f_2$, the second lens is arranged at a distance $z_2 \neq z_1$, $z_2 \neq f_2$ from the light source, wherein the distance $z_1$ is chosen such that the width, along the first axis, of the deflected light beam has a minimum at a pre-determined projection distance, and wherein the distance $z_2$ is chosen such that the width, along the second axis, of the deflected light beam has a minimum at the same or a further pre-determined projection distance. Both lenses are optionally cylindrical and have one planar side and one cylindrically shaped side. Compared to other solutions, lenses of this embodiment are cheaper to manufacture as it is easier to apply one curvature onto two individual lenses than to apply two curvatures onto a single lens—especially when the curvature shall be aspheric.

If the two lenses are not connected to each other, calibration is facilitated as both lenses can be moved freely. However, the two lenses may be connected to each other as then only one calibration step has to be performed. During connection, the difference of distances $z_2$ and $z_1$ is pre-calculated to set the appropriate connection distance.

For connection, it is advantageous if the first and the second lens are connected via at least one spacer at the periphery of the lenses as this allows for a quick and easy bond between two pre-manufactured lenses. Alternatively, for two connected lenses, the first and the second lens are formed on opposite sides of a transparent body, the thickness of the body being determined by the difference of the distances $z_1$ and $z_2$. In this embodiment, two pre-manufactured lenses can be glued together if they each exhibit a planar side opposite of one cylindrical side. Alternatively, the "two" connected lenses can be formed in a single "compound" if the lens has one cylindrical side facing the light source and one cylindrical side facing away from the light source.

In an alternative embodiment in which the divergence angle of the light beam is different in a first axis and in a second axis, said lens is an astigmatic lens and is configured to collimate the light beam differently in the first axis and in the second axis, wherein a first curvature of the lens for collimation in the first axis and a second curvature of the lens for collimation in the second axis are determined based on the mounting position of the lens at the distance $z_1$. This lens is more complicated to manufacture and requires a detailed pre-computation to determine the two curvatures, but once the lens is manufactured, calibration is especially easy as firstly only one calibration step has to be performed and secondly, if the lens has one planar side, the planar side can be aligned during calibrating.

In many embodiments, the apparatus has two or more light sources, each emitting a light beam with a different wavelength. This creates additional complications as firstly the refractive index of the lens is wavelength-dependent, meaning that each light beam is refracted differently by the lens, and secondly the divergence angle of the light beams can be different for each light source. In the simplest embodiments, two or more individual lenses are used, one for each light source, and the distance $z_1$ for which the width of the deflected light beam has a minimum at a pre-determined projection distance is individually chosen for each lens. However, two embodiments exist, in which only one lens (which can also be a block of two or more lenses mounted serially next to each other) is used.

In the first embodiment in which the apparatus has two or more light sources, each configured to emit a light beam with a different wavelength, the lens is used to collimate all light beams, wherein the distance $z_1$ is chosen such that the average beam width of all deflected light beams has a minimum at the pre-determined projection distance. This achieves a trade-off between a simple calibration of the lens and a decent quality of the projected light beams.

In the second embodiment in which the apparatus has two or more light sources, each configured to emit a light beam with a different wavelength, the lens is used to collimate all light beams, wherein the light sources are each arranged at a different distance from the lens. This allows the lens (which again can also be a block of two or more lenses mounted serially next to each other) to be mounted on a single position. However, each light source for itself has to be "calibrated", i.e., moved until the position is reached in which the width of the deflected light beam has a minimum at a pre-determined projection distance.

For choosing the distance $z_1$ (the same applies to $z_2$ in the following) such that the width of the deflected light beam has a minimum at a pre-determined projection distance, different disclosed solutions exist. Choosing the distance $z_1$ is henceforth also referred to as calibrating the apparatus.

In a first embodiment, the disclosed subject matter provides for a method for calibrating one of the aforementioned apparatuses comprising computationally determining the distance $z_1$ from the curvature of the mirror, the divergence angle of the light beam, the wavelength of the light beam, the focal length of the lens, the deflection angle, and the distance of the mirror to the light source; and mounting the lens at the determined distance $z_1$. This solution for choosing the distance is the most straight-forward in theory as all relevant factors only have to be computationally solved, usually by means of an analytical or numerical calculation.

However, it is difficult to firstly achieve the required precision and secondly to mount the lens at the determined distance $z_1$ without practical verification as even small deviations in the mirror curvature, lens precision etc. can lead to a drastic decline in quality. For these reasons, the disclosed subject matter provides further embodiments in which the calibration involves a direct measurement of the light beam after it has been collimated by the lens.

In the second embodiment for calibrating one of the aforementioned apparatuses, the method comprises arranging a light detector substantially at the pre-determined projection distance in the light path of the deflected light beam; moving the lens between the light source and the mirror until the light detector detects the minimum of the beam width; and mounting the lens at the distance $z_1$ for which the light detector detected the minimum beam width. Here, the beam width of the reflected beam is measured directly after it has been deflected by the MEMS mirror. This might achieve qualitatively the best results, but it is less practicable because the MEMS mirror is—in most cases— only mounted on the apparatus at a later stage in production after the light sources and lens have already been mounted and, optionally, calibrated.

In the third embodiment for calibrating one of the aforementioned apparatuses, the method comprises computationally determining a calibration distance for a minimum beam width from the curvature of the mirror, the divergence angle of the light beam, the wavelength of the light beam, the focal length of the lens, the deflection angle, and the distance of the mirror to the light source; before inserting the mirror into the light path of the light beam, arranging a light detector substantially at the determined calibration distance downstream of the lens in the light path of the light beam; moving the lens between the light source and the light detector until the light detector detects the minimum of the beam width; mounting the lens at the distance $z_1$ for which the light detector detected the minimum beam width; and mounting the mirror at said distance to the light source. This overcomes all of the aforementioned drawbacks such that the lens can be calibrated for the distance $z_1$ by means of a practical verification before mounting the MEMS mirror.

Optionally, the light detector is a planar detector for measuring a light intensity distribution. This can be used to measure the beam width ("beam waist") directly. However, it is only applicable if the minimum of the beam width is observable directly.

In the fourth embodiment for calibrating one of the aforementioned apparatuses, the method comprises computationally determining a calibration distance for a minimum beam width from the curvature of the mirror, the divergence angle of the light beam, the wavelength of the light beam, the focal length of the lens, the deflection angle, and the distance of the mirror to the light source; before inserting the mirror into the light path of the light beam, arranging a wavefront sensor in the light path of the light beam and determining the location of the minimum beam width by means of the measured wavefront; moving the lens between the light source and the wavefront sensor until the determined location of the minimum beam width corresponds to the calibration distance; mounting the lens at the distance $z_1$ at which the wavefront sensor detected that the minimum beam width corresponds to the calibration distance; and mounting the mirror at said distance to the light source. This is especially useful if the minimum beam width lies upstream ("virtual") of the lens in the light path, e.g., if the mirror to be mounted is a concave mirror. However, this calibration method can in principle be used also for a minimum beam width that lies downstream ("real") of the lens in the light path. If the minimum beam width is virtual, alternatively a second lens (or a system of additional lenses) can be arranged downstream of said lens as a calibration lens to shift the minimum beam width downstream of the second lens, in which case again the method of the third calibration embodiment can be performed.

BRIEF DESCRIPTION OF THE DRAWINGS

The disclosed subject matter shall now be explained in more detail below on the basis of exemplary embodiments thereof with reference to the accompanying drawings, in which:

FIGS. 8a, 8b, 9a and 9b show a combination of lenses for the disclosed apparatus in a first, second, third and fourth embodiment, respectively, in perspective views;

FIG. 10 shows an astigmatic lens for the disclosed apparatus in a perspective view;

DETAILED DESCRIPTION

Figure 1:
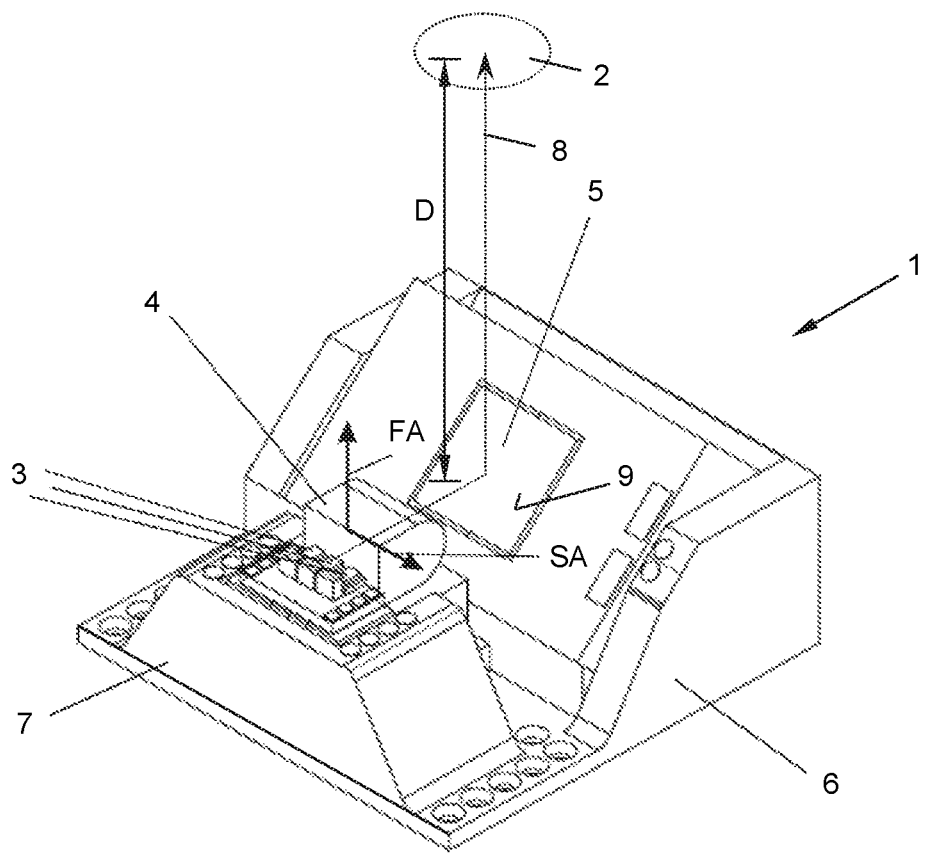
FIG. 1 shows a perspective view of the apparatus for projecting a light spot according to the disclosed subject matter.

FIG. 1 shows an apparatus 1 for projecting a light spot 2, for example onto a screen, onto an optical combiner such as a waveguide or reflector (e.g., with a "birdbath" or "bug eye" configuration), or directly into a human's eye at a predetermined projection distance D. The predetermined projection distance D can be arbitrarily chosen from a few mm up to infinity.

The apparatus comprises three light sources 3, a collimation lens 4, and a MEMS (micro-electro-mechanical system) mirror 5, each mounted on a common substrate 6. There may also be one, two, or more than three light sources 3. When manufacturing the apparatus 1, usually the light sources 3 and the lens 4 are first mounted on a submount 7, and then the submount 7 and the MEMS mirror 5 are mounted on the substrate 6.

The light sources 3 can be of any type known in the art configured to emit a light beam 8 having a wavelength λ. In most embodiments, the light source 3 are semiconductor light sources such as light emitting diodes or laser diodes, e.g., edge-emitting laser diodes or surface-emitting laser diodes, see EP 2 678 856 B1 for example. If more than one, e.g., three, light sources 3 are used, each light source 3 is configured to emit a light beam 8 having a different wavelength λ, e.g., to emit a red, a green, and a blue light beam 8. In the simplest case, however, only one light source 3 that emits one (usually monochromatic) light beam 8 is used, as is shown in FIGS. 2-7.

Figure 2:
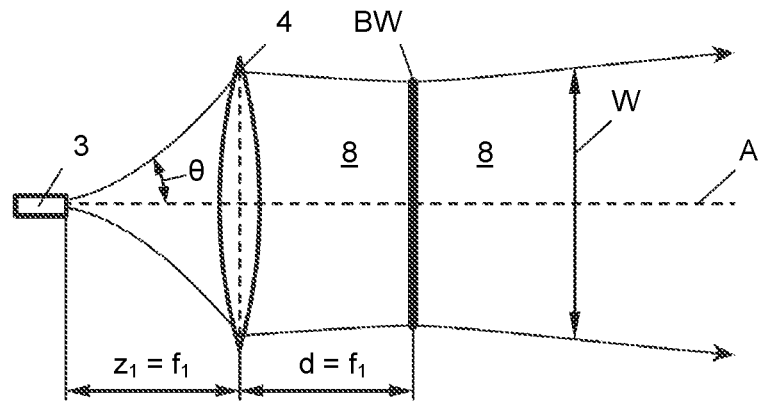
FIG. 2 shows a light source and a lens for collimating a non-linearly diverging light beam according to the state of the art in a schematic side view.

As shown in FIG. 2, the light source 3 emits a light beam 8 that is non-linearly diverging away from an axis A, which is due to the finite opening area of the light source 3 and the Gaussian emission of the light beam 8. The "non-linearity" refers to the envelope of the light beam 8 caused by diffraction; as an approximation a divergence angle θ can be attributed to the light beam 8 exiting the light source 3.

Figure 3:
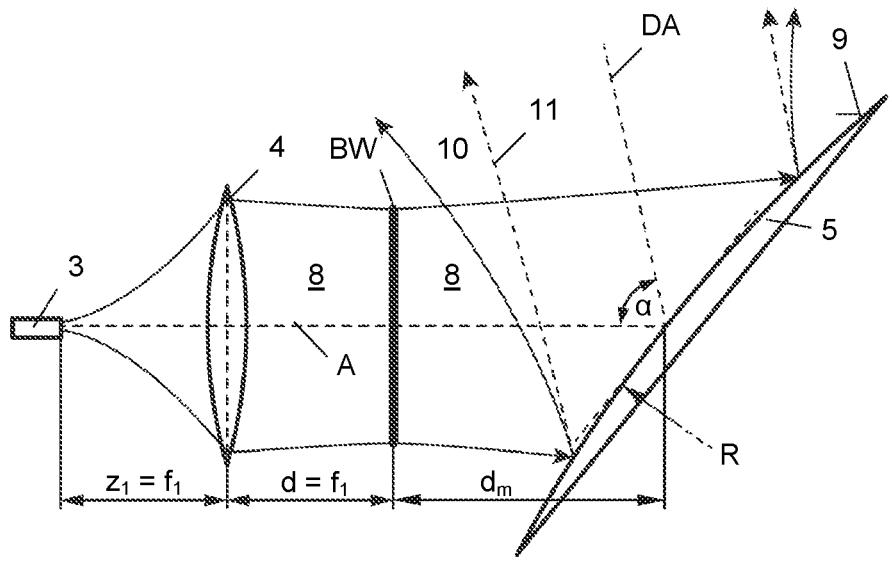
FIG. 3 shows the apparatus of FIG. 2 with an additional MEMS mirror with a curved surface and the resulting diverging light beam in a schematic side view.
Figure 5:
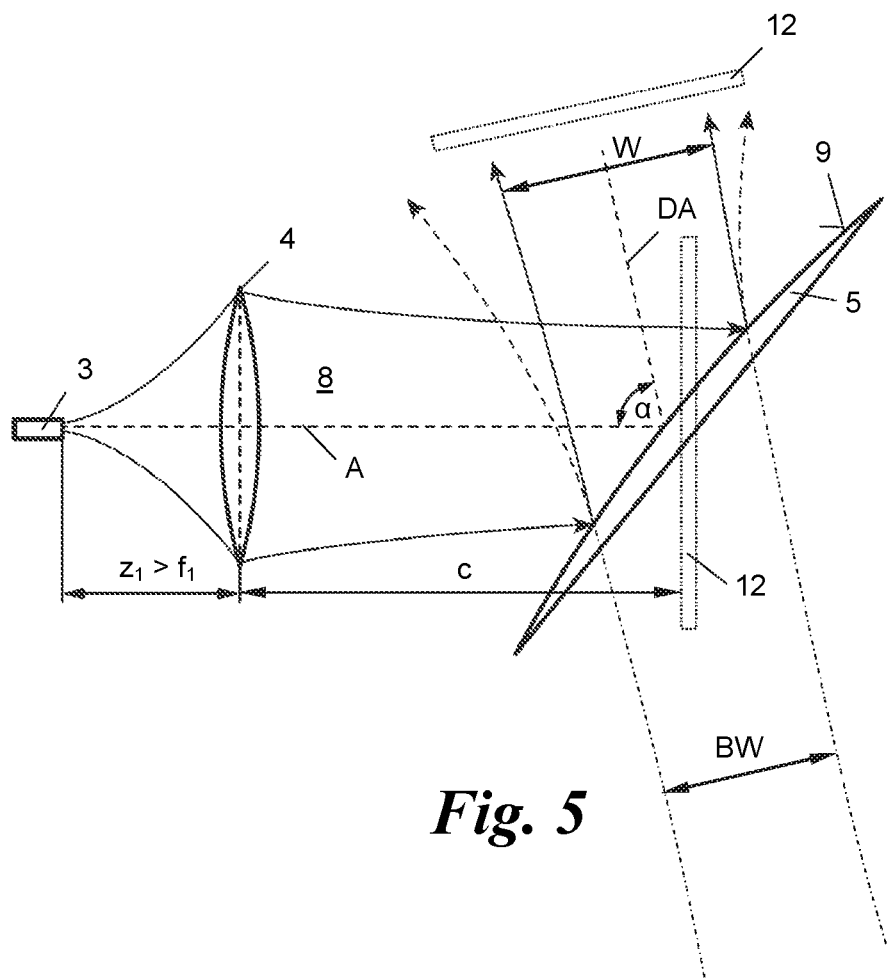
FIG. 5 shows the apparatus of FIG. 4 with an additional MEMS mirror with a convexly curved surface and the resulting collimated light beam in a schematic side view.

According to FIGS. 3 and 5, the MEMS mirror 5 is arranged in the path of the light beam 8 to deflect the light beam 8 about a deflection angle α. MEMS mirrors 5 can be actuated electronically to oscillate along an angle α, i.e., (symmetrically) about a nominal deflection angle $\alpha_0$, wherein the oscillation can be about one or two axes. This is used to project the light spot 2 along a line or area, creating a dynamic projection for the viewer. In the following, only the static situation is considered unless stated otherwise.

The mirror 5 furthermore has a reflective surface 9 with a known curvature R. The curvature R of the mirror surface 9 is an unwanted side-effect due to the manufacturing process of the mirror 5 and, e.g., caused by coating originally flat silicon substrates with a reflective film, for example an aluminum or a gold coating. Depending on the choice of coating material and thin film deposition parameters, the curvature R of the mirror surface 9 can be either convex or concave. The disclosed subject matter can, however, also be utilized for mirrors 5 whose surface curvature R has been manufactured by choice. Generally, the mirror 5 can also be a non-MEMS mirror, e.g. a macroscopic mirror, or a mirror system composed of several individual mirrors arranged in parallel and/or series, e.g., cascaded.

The collimation lens 4 is arranged between the light source/s 3 and the mirror 5 in the path of the light beam 8 to collimate said light beam 8. Depending on the embodiment, one lens 4 can be used for all light sources 3 or one lens 4 can be used for each light source 3. In the following, only the situation for one lens 4 collimating the light beam 8 of one light source 3 will be discussed unless stated otherwise.

As shown in FIG. 2, when the light source 3 emits the non-linearly diverging light beam 8, it is impossible to perfectly collimate this light beam 8, i.e., due to diffraction the beam inherently diverges from the axis A. The best possible collimation can be achieved by placing the lens 4 at a distance $z_1=f_1$ to the light source 3, $f_1$ being the focal length of the lens 4. With such an alignment of the lens 4 to the light source 3, a so-called beam waist BW forms at a distance $d=f_1$ downstream of the lens 4 in the direction of the light beam 8. After the light beam 8 is "collimated" by the lens 4, the light beam 8 converges towards the axis A until it reaches the beam waist BW, after which it diverges away from the axis A. The beam waist BW thus is the minimum of the beam width W of the light beam 8 in the light path after collimation by the lens 4 (before it is reflected by the mirror 5).

It can be seen that the light beam 8 still diverges after it has been "collimated" by the lens 4 in a region of the light path after the beam waist BW—but this is the smallest achievable (non-linear) divergence from an optimal collimation. If the lens 4 is moved away from the distance $z_1$ corresponding to the focal length $f_1$, not only is the beam waist BW moved away from its "optimally calibrated" position but also the divergence from an optimal collimation increases.

FIG. 3 shows the lens 4 at a distance $z_1=f_1$ to the light source 3 in combination with a mirror 5 having an (unintended) surface curvature R. Due to the deflection angle α of the mirror 5, the light beam 8 is deflected for projection. As indicated with numeral 10, the deviation from the optimal collimation, shown with numeral 11 for the deflected light beam 8, is caused by the curvature R, resulting in an additional unwanted spread of the light beam 8. This causes the projected light spot 2 at a projection distance D to be larger, i.e., less localized, than intended.

Figure 4:
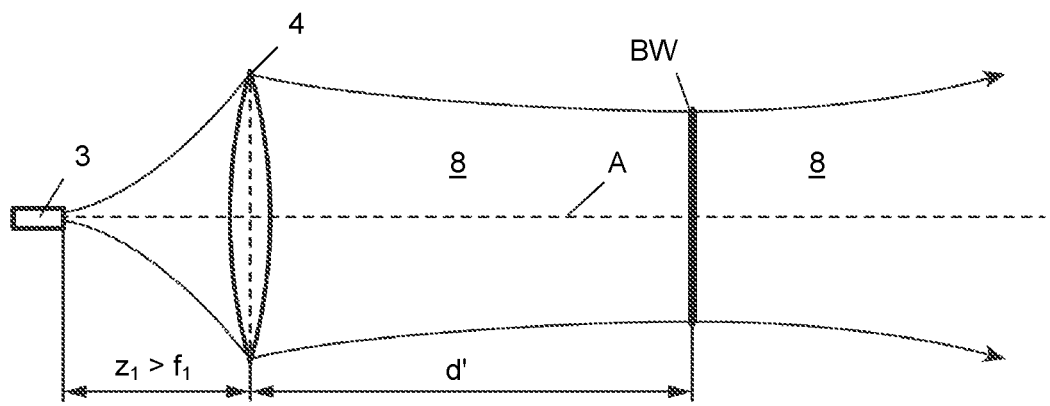
FIG. 4 shows a light source and a lens for collimating a non-linearly diverging light beam according to the disclosed subject matter in a schematic side view.

FIG. 4 shows the intentional misalignment of the lens 4 at a distance $z_1>f_1$ to the light source 3. This misalignment by itself causes firstly the beam waist BW to move to a distance d'>d and secondly a divergence of the light beam 8 after the beam waist BW that is greater than the one observed in the optimally calibrated case of FIG. 2. It should also be noted that the distance d of the beam waist BW to the lens 4 does not move linearly with the movement of the lens 4. While for typical microlenses the difference of $z_1-f_1$ lies in the range of a few μm, the difference of d'-d may lie in the range of a few mm or cm.

FIG. 5 shows the scenario of FIG. 4 with a distance $z_1>f_1$ in combination with a convexly shaped mirror 5. In this scenario, the distance $z_1$ has been chosen such that the deflected beam 8 is optimally collimated after deflection, which is achieved by synergizing the non-linear divergence (the amount of which has been adjusted by choosing the distance $z_1$) with the curvature R of the mirror surface 9.

The collimation of the light beam 8 after deflection by the mirror 5 causes the width W of the deflected light beam 8 to have a minimum at the pre-determined projection distance D. The minimum beam width achievable at said pre-determined projection distance D is usually larger than the beam waist BW of the deflected light beam 8, which may occur at a "virtual" point along the deflection axis DA "behind" the mirror 5 (FIG. 5).

To choose the optimal distance $z_1$ for achieving the minimum beam width W at the distance D, various calibration methods can be employed. Firstly, the distance $z_1$ can be determined computationally without the need to measure any properties of the collimated and/or deflected beam 8. Secondly, instead of computing any factor of the apparatus 1, the width W of the deflected light beam 8 can directly be measured at the pre-determined projection distance D. Thirdly, the width W of the collimated beam 8 can be measured before deflection to calibrate the distance $z_1$ of the lens 4 before mounting the mirror 5.

In the first of said three embodiments, the calibration method comprises computationally determining the distance $z_1$ from the curvature R of the mirror 5, the divergence angle θ of the light beam 8, the wavelength λ of the light beam 8, the focal length $f_1$ of the lens 4, the deflection angle α chosen for calibration, and the distance $d_m$ of the mirror 5 to the light source 3. Knowing all these factors, an equation can be formulated and solved analytically or numerically, optionally with approximation techniques. For example, under the condition that the width of the deflected light beam has a minimum at the pre-determined projection distance D, the distance $z_1$ can be computationally determined from the following equation:

$$z_1 = \frac{-(\beta\varepsilon + \gamma\delta) - \sqrt{(\beta\varepsilon + \gamma\delta)^2 - 4\beta\delta\left[\gamma\varepsilon + \beta\delta\left(\frac{\lambda}{\pi\theta^2}\right)^2\right]}}{2\beta\delta} \text{ with}$$

$$\beta = 1 - \frac{2D}{R\cos\left(\frac{\alpha}{2}\right)} - \frac{d_m}{f_1}\left[1 - \frac{2D}{R\cos\left(\frac{\alpha}{2}\right)}\right] - \frac{D}{f_1}$$

$$\gamma = \left[1 - \frac{2D}{R\cos\left(\frac{\alpha}{2}\right)}\right]d_m + D$$

$$\delta = -\frac{2}{R\cos\left(\frac{\alpha}{2}\right)} - \frac{1}{f_1}\left[1 - \frac{2d_m}{R\cos\left(\frac{\alpha}{2}\right)}\right]$$

$$\varepsilon = 1 - \frac{2d_m}{R\cos\left(\frac{\alpha}{2}\right)}$$

After a value for the distance $z_1$ has been found, the lens 4 is mounted at this distance $z_1$, e.g., on the submount 7 to be mounted on the substrate 6. Thereafter (or beforehand) the mirror 5 can be mounted on the substrate 6.

In the second embodiment for calibration, the light source 3 and the mirror 5 are mounted on the substrate 6, whereas the lens 4 is movable and not yet mounted. Then, a light detector 12 is arranged substantially at the pre-determined projection distance D in the light path of the deflected light beam 8 and the lens 4 is moved between the light source 3 and the mirror 5 until the light detector 12 detects the minimum of the beam width W, see FIG. 5. Thereafter, the lens 4 is mounted (for example fixated by UV-hardening a glue mounting the lens 4 on the submount 7) at the distance $z_1$ for which the light detector 12 detected the minimum beam width W.

The light detector 12 can for example be a planar detector for measuring a light intensity distribution, e.g., a CCD (charge-coupled device) camera or scanning-aperture apparatus. Such a planar detector can depict—or alternatively output a numerical value of—the width W of the light beam 8 in real-time or at least near real-time.

In the third embodiment for calibrating the apparatus 1, see also FIG. 5, in the beginning only the light source 3 is mounted on the substrate 6 or the submount 7, whereas the lens 4 is movable and not yet mounted on the substrate 6 or submount 7. In this case, the mirror 5 is only mounted at a later stage of manufacture of the apparatus 1, e.g. by mounting the submount 6 then the substrate 7 where the mirror 5 had been installed. To again implement a measurement technique for calibration, the curvature of the mirror 5 has to be known beforehand as the distance $z_1$ has to be chosen depending on the mirror curvature R. Now, a "calibration distance" c for a minimum beam width W (i.e., the beam waist BW) is computationally determined from the curvature R of the mirror, the divergence angle θ of the light beam 8, the wavelength λ of the light beam 8, the focal length $f_1$ of the lens 4, the deflection angle α intended for calibration, and the distance $d_m$ of the mirror 5 to the light source 3 from the following equation:

$$c = \frac{\frac{1}{f_1}\left(\frac{\lambda}{\pi\theta^2}\right)^2 - z_1\left(1 - \frac{z_1}{f_1}\right)}{\left(1 - \frac{z_1}{f_1}\right)^2 + \left(\frac{\lambda}{f_1\pi\theta^2}\right)^2}$$

In contrast to the first embodiment for calibration, not the distance $z_1$ is computationally determined but the calibration distance c at which the minimum of the beam width W should occur, i.e., the distance d' of the beam waist BW.

Before the mirror 5 is inserted into the light path of the light beam 8, the light detector 12 is thus arranged substantially at the determined calibration distance c=d' downstream of the lens 4 in the light path of the light beam 8. Now the lens 4 is moved between the light source 3 and the light detector 12 until the light detector 12 detects the minimum of the beam width W. Thereafter, the lens 4 is mounted (for example fixated by UV-hardening a glue mounting the lens 4 on the substrate 6 or submount 7) at the distance $z_1$ for which the light detector 12 detected the minimum beam width W. Again, the light detector 12 can be a planar detector for measuring a light intensity distribution as described above.

Figure 6:
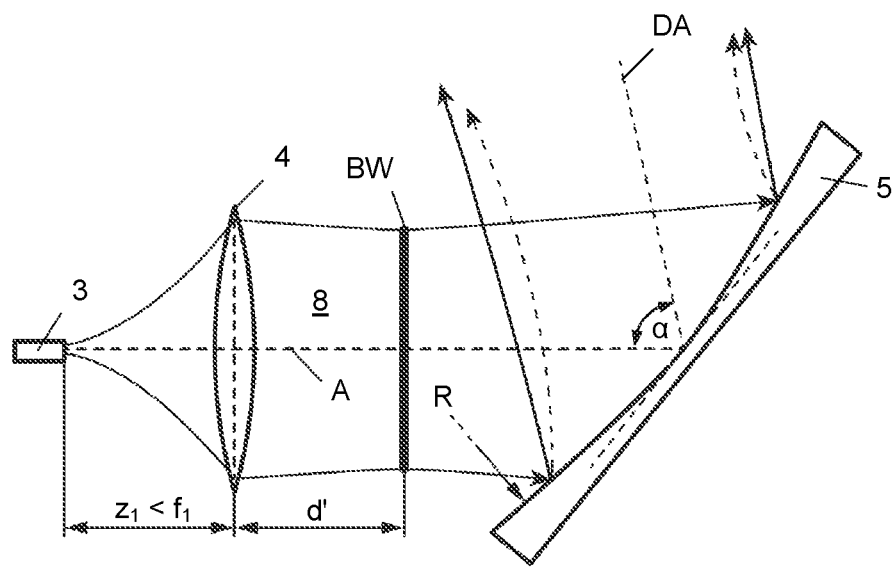
FIG. 6 shows the apparatus of FIG. 4 with an additional MEMS mirror with a concavely curved surface and the resulting collimated light beam in a schematic side view.

FIG. 6 shows the scenario of FIG. 4 with a distance $z_1 < f_1$ in combination with a concavely shaped mirror 5. Again, as described for FIG. 5, the collimation of the light beam 8 after deflection by the mirror 5 causes the width W of the deflected light beam 8 to have a minimum at the pre-determined projection distance D.

All aspects relating to the calibration and the options for the pre-determined projection distance hold for this embodiment, too, as long as the beam waist BW lies downstream of the lens 4 in the light path. It can readily be seen that moving the lens 4 closer to the light source 3 ($z_1 < f_1$) causes the beam waist BW to approach the lens 4. It has been mentioned before that the distance d of the beam waist BW to the lens 4 does not linearly change with the movement of the lens 4. For this reason, in case that the lens 4 moves to a distance $z_1 < f_1$ closer to the light source 3 than in FIG. 6, the beam waist BW can even move to an area upstream of the lens 4 and even the light source 3, seen in the direction of the light path, and is thus considered to be virtual, see FIG. 7. In this case, the light beam 8 diverges away from the axis A as soon as it is "collimated" by the lens 4.

Figure 7:
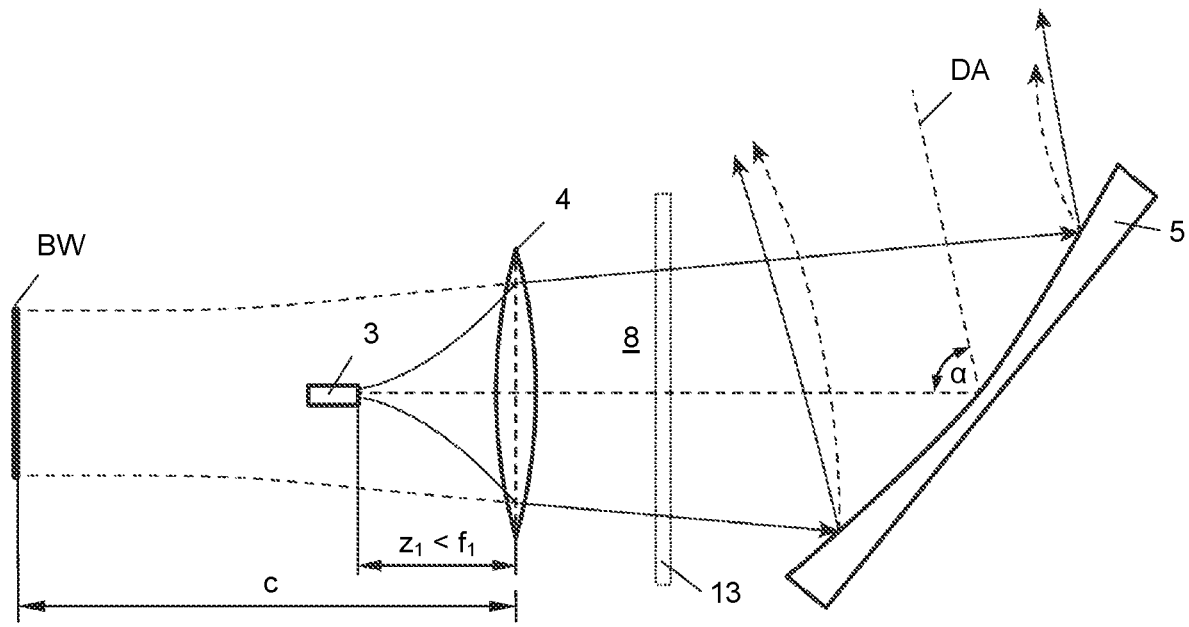
FIG. 7 shows a calibration setup for calibrating the apparatus of FIG. 6.

In the case of FIG. 7, the first and second calibration embodiment as describes above can still be performed. The third embodiment for calibration, however, needs adjustment because the minimum of the beam width W, the beam waist BW, cannot be directly measured anymore.

To solve this problem, again first a calibration distance c (here: "negative", left from the lens 4), for the minimum beam width W (beam waist BW) is computationally determined from the curvature R of the mirror 5, the divergence angle of the light beam 8, the wavelength λ of the light beam 8, the focal length $f_1$ of the lens 4, the deflection angle α intended for calibration, and the distance $d_m$ of the mirror 5 to the light source 3. Then, before the mirror 5 is inserted into the light path of the light beam 8, a wavefront sensor 13 is arranged in the light path of the collimated light beam 8 in a distance to the lens 4 that can in principle be arbitrarily chosen but should be known for the following computations.

The wavefront sensor 13, for example a Shack-Hartmann wavefront sensor, measures the phase distribution and wavefront radius of curvature of the incident light beam 8 and can therefrom directly determine at which distance the (real or virtual) beam waist BW is located from the wavefront sensor 13. The lens 4 is then moved between the light source 3 and the wavefront sensor 13 until the location of the minimum beam width W corresponds to the calibration distance c. Once the minimum beam width W is located at the calibration distance, the lens 4 is mounted at this distance $z_1$. Thereafter, the mirror 5 can be mounted on the substrate 6.

Alternatively, if the minimum beam width W is virtual, an auxiliary lens (or a system of auxiliary lenses) can be arranged downstream of the lens 4 as a calibration lens to shift the minimum beam width W downstream of the auxiliary lens (to make the minimum beam width W "real"), in which case again the method of the third calibration embodiment as described with reference to FIGS. 5 and 6 can be performed.

With respect to FIG. 1 it is further shown that each light source 3 may emit a light beam 8 that diverges differently in a first axis (fast axis) FA and in a second axis (slow axis) SA, which is due to the type of the chosen light source 3. Edge-emitting diode lasers, for example, emit such differently diverging light beams 8, while surface-emitting laser diodes emit light beams 8 that diverge substantially the same in all directions perpendicular to the axis A.

As the lens 4 collimates the light beam 8 depending on its divergence angle, improvements can be made for a light beam 8 that diverges differently in two axes FA, SA. For example, two cylindrical lenses 4, 14 with different focal lengths $f_1$, $f_2$ can be employed, see FIG. 8. The first lens 4 collimates the light beam 8 in the fast axis FA and is thus a fast axis collimation (FAC) lens and the second lens 14 collimates the light beam 8 in the slow axis SA and is thus a slow axis collimation (SAC) lens. If more than one, e.g., three, light sources 3 are used, as shown in FIG. 1, one of the cylindrical lenses 4 can be elongated with one common axis of curvature to cover all three light beams 8 and the other can comprise three repeating cylindrical sections 14', 14" and 14'" with three parallel axes of curvature, which each cover one light beam 8.

In order to correct the curvature R of the mirror 5 with each of the lenses 4, 14, the first lens 4 is mounted at the distance $z_1$ and the second lens 14 is mounted at a distance $z_2$ from the light source 3. Again, each distance $z_1$, $z_2$ is chosen such that the distance of the lens 4, 14 to the light source 3 does not equal the respective focal length $f_1$, $f_2$. For the first lens 4, the distance $z_1$ is chosen such that the width W, along the first axis FA, of the deflected light beam 8 has a minimum at the pre-determined projection distance D. For the second lens 14, the distance $z_2$ is chosen such that the width W, along the second axis SA, of the deflected light beam 8 has a minimum at said pre-determined projection distance D, or at a further (different) pre-determined projection distance, if required.

The two lenses 4, 14 can either be individually mounted (and calibrated) or already mounted together in a distance corresponding to the difference of the distances $z_1$ and $z_2$. As can be seen in FIG. 8a, the first and the second lens 4, 14 can be connected via at least one spacer 15 at the periphery of the lenses 4, 14. Other connection techniques are feasible, too.

Alternatively, as can be seen in FIG. 8b, the first and the second lens 4, 14 can be formed as one, e.g., on opposite sides of a transparent body, the thickness of the body being determined by the difference of the distances $z_1$ and $z_2$. In this case, two individual lenses 4, 14 can either be glued together if they have connectable sides, e.g., if both lenses 4, 14 have a planar side and an opposing side exhibiting the curvature of the respective lens 4, 14, or formed integrally as a single component, manufactured for example by molding the compound lens 4, 14 in a single manufacturing step.

FIG. 9a shows a variant of the embodiment of FIG. 8a, wherein the three cylindrical sections 14', 14" and 14'" of the second lens 14 are "staggered", i.e., placed at individual distances $z_2$, to account for the different wavelengths $\lambda$ of three light sources 3 of different colors.

FIG. 9b shows a further variant of the embodiments of FIGS. 8a and 9a, wherein also the first lens 4 is split into individual sections 4', 4" and 4'" which are "staggered", i.e., placed at individual distances $z_1$, to account for such different wavelengths $\lambda$.

FIG. 10 shows an embodiment for a single lens 4 that is capable of collimating a beam 8 diverging differently in two axes FA, SA. This lens 4 is an astigmatic lens configured to collimate the light beam 8 differently in the first axis FA and in the second axis SA. The lens is placed at the distance $z_1$ as previously disclosed. Furthermore, the lens 4 has a first curvature $\Phi$ for collimation in the first axis FA and a second curvature $\psi$ for collimation in the second axis SA. The curvatures $\Phi$, $\psi$ are determined based on the mounting position of the lens at the distance $z_1$. This lens can have a planar side and a side exhibiting the curvatures $\Phi$, $\psi$ or exhibit a fraction of the curvatures $\Phi$, $\psi$ on each side.

All embodiments dealing with different divergence angles $\theta$ of the light source 3 in the two axes FA and SA by using lenses 4, 14 at different distances $z_1$, $z_2$ and/or with different focal lengths $f_1$, $f_2$ or curvatures $\Phi$, $\psi$ are equally suited for dealing with different mirror curvatures R in the two axes SA, FA, or even for achieving different projection distances D in the two axes SA, FA, if required.

As previously mentioned, the mirror 5 is a MEMS mirror that oscillates about a nominal deflection angle $\alpha_0$ between a minimum and a maximum deflection angle $\alpha_{min}$, $\alpha_{max}$. The nominal deflection angle $\alpha_0$ is the "middle" position of the mirror, i.e., the position from which the mirror 5 can rotationally deviate the same amount in opposing directions. Depending on the embodiment, the mirror 5 can oscillate about one or two axes but in the following only the situation for one oscillation axis is disclosed as the same concept is easily extendible to the oscillation about a second axis.

Figure 11:
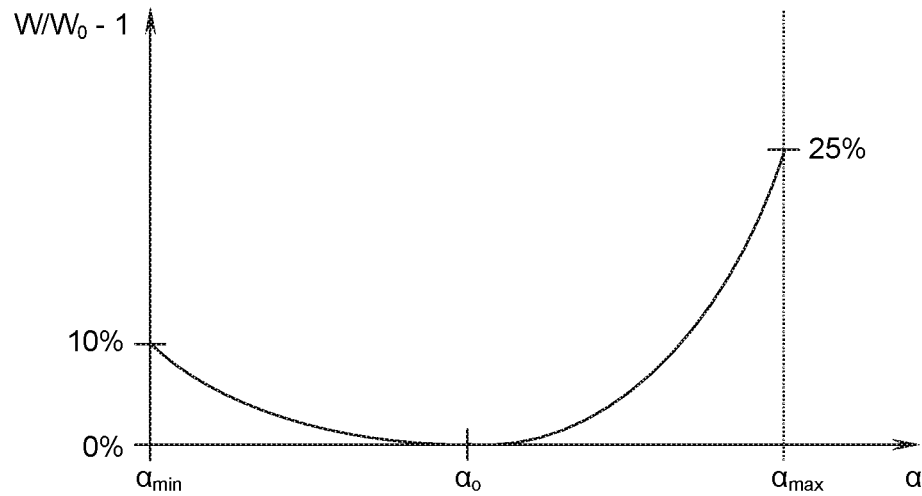
FIG. 11 shows a diagram of the change of beam width deterioration upon changing the deflection angle when the apparatus is calibrated to a nominal deflection angle of the mirror.

In FIG. 11, on the vertical axis the change $W/W_0$ of beam width W with respect to the beam width W at the calibrated deflection angle is depicted and on the horizontal axis the deflection angle $\alpha$ is depicted. In the situation of FIG. 11, the apparatus 1 is calibrated to the nominal deflection angle $\alpha_0$ of the mirror 5. It can be seen that the deterioration of the beam width W is not symmetrical, e.g., the beam width $W_0$ is only 10% larger if the mirror 5 pivots to the minimum deflection angle $\alpha_{min}$ but 25% larger if the mirror 5 pivots to the maximum deflection angle $\alpha_{max}$.

Figure 12:
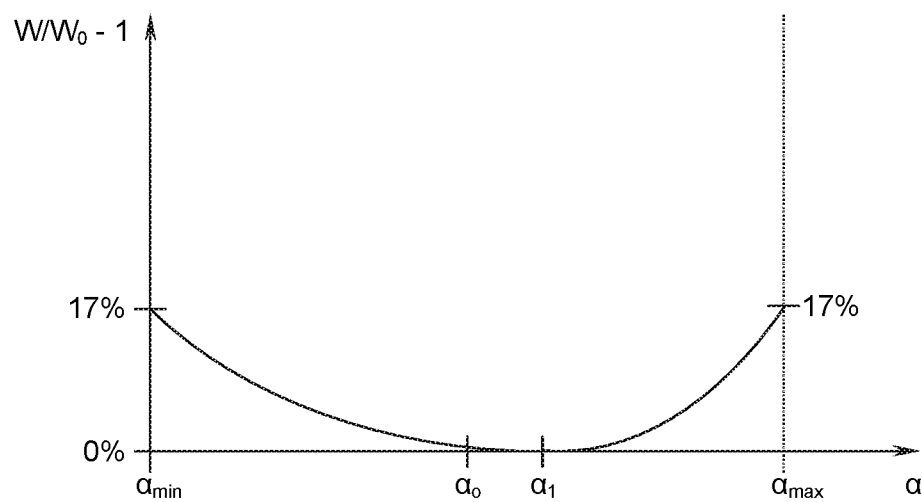
FIG. 12 shows a diagram of the change of beam width deterioration upon changing the deflection angle when the apparatus is calibrated to an intermediate deflection angle of the mirror.

In FIG. 12, again on the vertical axis the change $W/W_0$ of beam width W with respect to the beam width $W_0$ at the calibrated deflection angle is depicted and on the horizontal axis the deflection angle $\alpha$ is depicted. In the situation of FIG. 12, however, the apparatus 1 is calibrated to an intermediate deflection angle $\alpha_1$ of the mirror 5. The distance $z_1$ is chosen such that the width W of the deflected light beam has a minimum at the intermediate angle $\alpha_1$ different from said nominal deflection angle $\alpha_0$ in order to have the same beam width W at the minimum and the maximum deflection angle $\alpha_{min}$, $\alpha_{max}$. In other words, the distance $z_1$ and thus the intermediate deflection angle $\alpha_1$ is chosen such that the maximum deterioration of the beam width W is symmetrical, e.g., the beam width W is 17% larger if the mirror 5 pivots to the minimum deflection angle $\alpha_{min}$ and 17% larger if the mirror 5 pivots to the maximum deflection angle $\alpha_{max}$. This yields smoother images projected by the apparatus 1.

It has been mentioned that the distance $z_1$ depends on, among others, the wavelength $\lambda$ and the divergence angle $\theta$ of the light beam 8. In situations as shown in FIG. 1, in which three (or two or more than three) light sources 3 are used that either have different wavelengths $\lambda$ and/or different divergence angles $\theta$, one lens 4 can be used for each light source 3—notwithstanding the additional lens 14 of FIGS. 8-10 in which one light beam 8 has different divergence angles $\theta$ for the first axis FA and the second axis SA.

Alternatively, only one lens 4 can be used to collimate all three light beams 8 of the light sources 3. In this case, the distance $z_1$ can be chosen such that the average beam width W of all deflected light beams 8 has a minimum at the pre-determined projection distance D. For example, such a common lens 4 can be calibrated for the light source 3 emitting the light beam 8 whose wavelength $\lambda$ lies (numerically) between the wavelengths $\lambda$ of the other light beams 8.

Alternatively, if only one common lens 4 is used to collimate all light beams 8, an individual calibration can be performed if the light sources 3 are each arranged at a different distance from the lens 4. The calibrations for the light sources 3 can be done individually, e.g., by firstly determining the distance $z_1$ for the lens 4 for one light source 3 and then moving the other light sources 3 until the light detector 12 or wavefront sensor 13 determines the correct position for the respective light source 3. Alternatively, again a pure computational calibration can be performed, too.

It is also possible to pre-determine the differences for the light sources 3 and incorporate them in the design of the lens 4, 14, for example in the embodiments of FIGS. 8, 9 the first lens 4 can be conical instead of cylindrical and the second lens 14 can have three cylindrical section, each having a different curvature $\Phi$.

Applications of the disclosed apparatus 1 include, e.g., the projection of a light spot 2 onto a viewing zone, may it be a screen or directly onto an audience, augmented reality (AR), virtual reality (VR), and mixed reality (MR) head-mounted displays (HMD), head-up displays (HUD), pico projectors, etc., where the light spot 2 being scanned by the oscillating mirror projects an image onto a screen, onto an optical combiner such as a waveguide or reflector (e.g., in "birdbath" or "bug eye" configuration), or even directly into a human's eye.

The disclosed subject matter is thus not restricted to the specific embodiments described in detail herein, but encompasses all variants, combinations, and modifications thereof that fall within the framework of the appended claims.

What is claimed is:

1. An apparatus for projecting a light spot, comprising a light source emitting a light beam having a wavelength and a divergence angle,
    a mirror arranged in the path of the light beam to deflect said light beam about a nominal deflection angle, the mirror having a surface with a known curvature, and
    a collimation lens arranged between the light source and the mirror in the path of the light beam,
    wherein the lens is mounted at a distance $z_1 \neq f_1$ from the light source, $f_1$ being the focal length of the lens,
    wherein the distance $z_1$ is chosen such that the width of the deflected light beam has a minimum at a pre-determined projection distance, and wherein the mirror is convex and the distance $z_1$ is larger than the focal length $f_1$ or wherein the mirror is concave and the distance $z_1$ is smaller than the focal length $f_1$.

2. The apparatus according to claim 1, wherein the mirror is configured to oscillate about said nominal deflection angle between a minimum and a maximum deflection angle and the distance $z_1$ is chosen such that the width of the deflected light beam has a minimum at an intermediate angle different from said nominal deflection angle in order to have the same beam width at the minimum and the maximum deflection angle.

3. The apparatus according to claim 1, wherein the divergence angle of the light beam is different in a first axis and in a second axis,
    wherein said lens is configured to collimate the light beam only in the first axis,
    wherein the apparatus further comprises a second lens configured to collimate the light beam only in the second axis and having a second focal length $f_2$,
    wherein the second lens is arranged at a distance $z_2 \neq z_1$, $z_2 \neq f_2$ from the light source,
    wherein the distance $z_1$ is chosen such that the width, along the first axis, of the deflected light beam has a minimum at the pre-determined projection distance, and
    wherein the distance $z_2$ is chosen such that the width, along the second axis, of the deflected light beam has a minimum at the same or a further pre-determined projection distance.

4. The apparatus according to claim 3, wherein the first and the second lens are connected via at least one spacer at the periphery of the lenses.

5. The apparatus according to claim 3, wherein the first and the second lens are formed on opposite sides of a transparent body, the thickness of the body being determined by the difference of the distances $z_2$ and $z_1$.

6. The apparatus according to claim 1, wherein the divergence angle of the light beam is different in a first axis and in a second axis,
    wherein said lens is an astigmatic lens and is configured to collimate the light beam differently in the first axis and in the second axis,
    wherein a first curvature of the lens for collimation in the first axis and a second curvature of the lens for collimation in the second axis are determined based on the mounting position of the lens at the distance $z_1$.

7. The apparatus according to claim 1, wherein the apparatus has two or more light sources, each configured to emit a light beam with a different wavelength, and the lens is used to collimate all light beams,
    wherein the distance $z_1$ is chosen such that the average beam width of all deflected light beams has a minimum at the pre-determined projection distance.

8. The apparatus according to claim 1, wherein the apparatus has two or more light sources, each configured to emit a light beam with a different wavelength, and the lens is used to collimate all light beams,
    wherein the light sources are each arranged at a different distance from the lens.

9. A method for calibrating an apparatus according to claim 1, comprising
    computationally determining the distance $z_1$ from the curvature of the mirror, the divergence angle of the light beam, the wavelength of the light beam, the focal length $f_1$ of the lens, the deflection angle, and the distance of the mirror to the light source; and mounting the lens at the determined distance $z_1$.

10. A method for calibrating an apparatus according to claim 1, comprising
- arranging a light detector substantially at the pre-determined projection distance in the light path of the deflected light beam;
- moving the lens between the light source and the mirror until the light detector detects the minimum of the beam width; and
- mounting the lens at the distance $z_1$ for which the light detector detected the minimum beam width.

11. A method for calibrating an apparatus according to claim 1, comprising
- computationally determining a calibration distance for a minimum beam width from the curvature of the mirror, the divergence angle of the light beam, the wavelength of the light beam, the focal length $f_1$ of the lens, the deflection angle, and the distance of the mirror to the light source;
- before inserting the mirror into the light path of the light beam, arranging a light detector substantially at the determined calibration distance downstream of the lens in the light path of the light beam;
- moving the lens between the light source and the light detector until the light detector detects the minimum of the beam width;
- mounting the lens at the distance $z_1$ for which the light detector detected the minimum beam width; and
- mounting the mirror at said distance to the light source.

12. The method according to claim 11, wherein the light detector is a planar detector for measuring a light intensity distribution.

13. The method according to claim 10, wherein the light detector is a planar detector for measuring a light intensity distribution.

14. The method according to claim 11, wherein the light detector is a planar detector for measuring a light intensity distribution.

15. A method for calibrating an apparatus according to claim 1, comprising
- computationally determining a calibration distance for a minimum beam width from the curvature of the mirror, the divergence angle of the light beam, the wavelength of the light beam, the focal length $f_1$ of the lens, the deflection angle, and the distance of the mirror to the light source;
- before inserting the mirror into the light path of the light beam, arranging a wavefront sensor in the light path of the light beam and determining the location of the minimum beam width by means of the measured wavefront;
- moving the lens between the light source and the wavefront sensor until the determined location of the minimum beam width corresponds to the calibration distance;
- mounting the lens at the distance $z_1$ at which the wavefront sensor detected that the minimum beam width corresponds to the calibration distance; and
- mounting the mirror at said distance to the light source.

\* \* \* \* \*